United States Patent
Li et al.

(10) Patent No.: US 10,985,706 B1
(45) Date of Patent: Apr. 20, 2021

(54) HYSTERESIS COMPARATOR

(71) Applicant: Artery Technology Co., Ltd., Chongqing (CN)

(72) Inventors: Chao Li, Chongqing (CN); Zhengxiang Wang, Chongqing (CN); Baotian Hao, Chongqing (CN); Weitie Wang, Chongqing (CN)

(73) Assignee: Artery Technology Co., Ltd., Chongqing (CN)

( * ) Notice: Subject to any disclaimer, the term of this patent is extended or adjusted under 35 U.S.C. 154(b) by 0 days.

(21) Appl. No.: 16/893,402

(22) Filed: Jun. 4, 2020

(30) Foreign Application Priority Data

Oct. 21, 2019 (CN) .......................... 201911000669.X

(51) Int. Cl.
| | |
|---|---|
| *H03K 5/22* | (2006.01) |
| *H03F 1/38* | (2006.01) |
| *G01R 19/00* | (2006.01) |
| *H03K 3/023* | (2006.01) |
| *H03K 5/24* | (2006.01) |

(52) U.S. Cl.
CPC ............ *H03F 1/38* (2013.01); *G01R 19/0038* (2013.01); *G01R 19/0046* (2013.01); *H03K 3/023* (2013.01); *H03K 5/22* (2013.01); *H03K 5/2481* (2013.01)

(58) Field of Classification Search
CPC .......... H03K 5/22; H03K 5/24; H03K 5/2472; H03K 5/2481; H03K 3/023; H03K 3/02337; H03K 3/0377; H03K 3/13; H03K 3/2893; H03K 3/3565; H03F 1/38; H03F 3/45479; G01R 19/0038; G01R 19/0046
See application file for complete search history.

(56) References Cited

U.S. PATENT DOCUMENTS

| | | | |
|---|---|---|---|
| 10,418,952 B1* | 9/2019 | Abhishek | ............ H03F 3/45179 |
| 2013/0120046 A1 | 5/2013 | Prohaska | |
| 2015/0263718 A1 | 9/2015 | Xiao | |
| 2016/0373102 A1* | 12/2016 | Wu | ...................... H03K 5/2481 |

FOREIGN PATENT DOCUMENTS

TW     201208257 A1     2/2012

* cited by examiner

*Primary Examiner* — Long Nguyen
(74) *Attorney, Agent, or Firm* — Winston Hsu

(57) ABSTRACT

The present invention discloses a hysteresis comparator comprising an input stage, a hysteresis current generating circuit and an output stage. In the operation of the hysteresis comparator, the input stage is configured to receive a pair of differential input signals to generate at least one differential current signal; the hysteresis current generating circuit is configured to generate at least one hysteresis current to adjust the differential current signal to generate an adjusted differential current signal, wherein the hysteresis current generating circuit includes a common mode voltage detecting circuit for detecting a common mode voltage of the differential input signal for generating the hysteresis current; and the output stage is configured to generate an output signal according to the adjusted differential current signal.

4 Claims, 4 Drawing Sheets

HYSTERESIS COMPARATOR

BACKGROUND OF THE INVENTION

1. Field of the Invention

The present invention relates to a hysteresis comparator.

2. Description of the Prior Art

In conventional hysteresis comparators, the hysteresis voltage changes with the change of the common mode voltage of the input signal. To solve this issue, some related art techniques, such as U.S. Pat. Nos. 9,651,091, 8,310,279 and 9,654,091, have provided some associated solutions to keep the hysteresis voltage at a fixed value. However, to implement any of the aforementioned related art techniques requires additional circuit elements, thus increasing the manufacturing cost and raising the complexity in design.

SUMMARY OF THE INVENTION

In view of the above, an objective of the present invention is to provide a hysteresis comparator, which requires less circuit elements to achieve the goal of maintaining the hysteresis voltage at a fixed value, so as to solve the problems encountered in related art techniques.

An embodiment of the present invention discloses a hysteresis comparator, which comprises an input stage, a hysteresis current generating circuit and an output stage. The input stage is configured to receive a pair of differential input signals to generate at least one differential current signal. The hysteresis current generating circuit is configured to generate at least one hysteresis current to adjust the differential current signal to generate an adjusted differential current signal, wherein the hysteresis current generating circuit comprises a common mode voltage detecting circuit to detect a common mode voltage of the differential input signals for generating the hysteresis current. The output stage is configured to generate an output signal according to the adjusted differential current signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
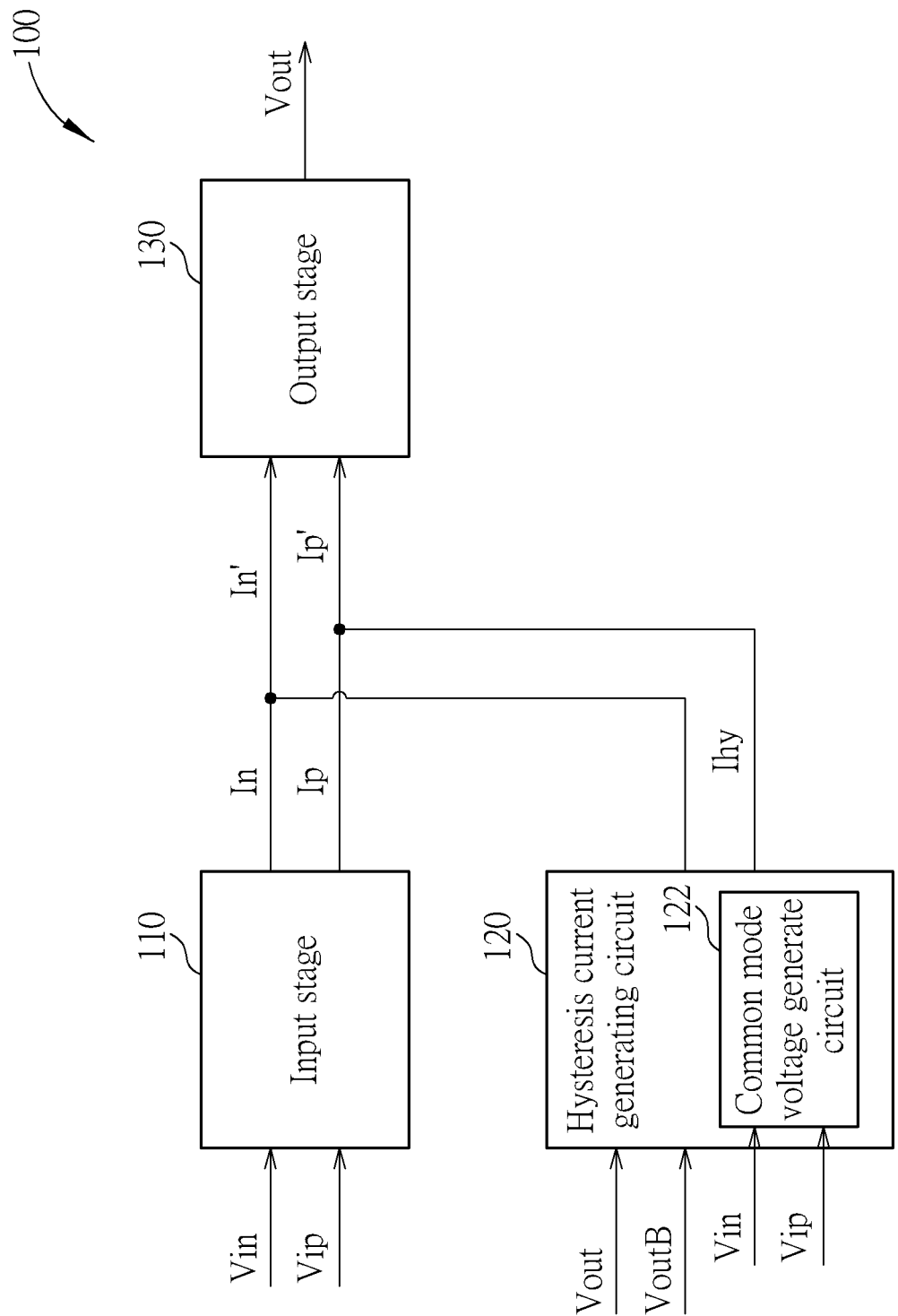
FIG. 1 is a diagram illustrating a hysteresis comparator according to an embodiment of the present invention.

FIG. 1 is a diagram illustrating a hysteresis comparator 100 according to an embodiment of the present invention. As shown in FIG. 1, the hysteresis comparator 100 comprises an input stage 110, a hysteresis current generating circuit 120 and an output stage 130, wherein the hysteresis current generating circuit 120 comprises a common mode voltage generate circuit 122.

Figure 2:
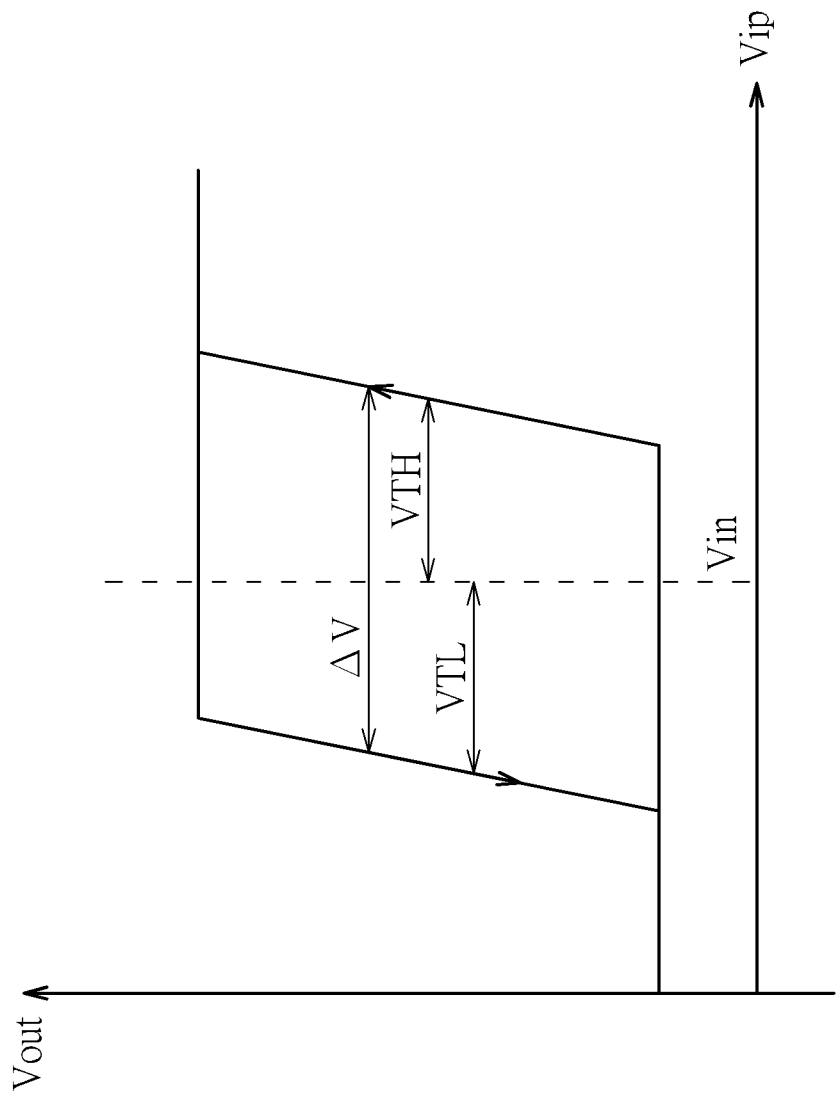
FIG. 2 is a diagram illustrating the operations of a hysteresis comparator.

In the operation of the hysteresis comparator 100, the input stage 110 receives a pair of differential input signals Vin and Vip to generate at least one pair of differential current signals In and Ip. Next, the hysteresis current generating circuit 120 generates at least one hysteresis current Ihy according to an output signal Vout of the hysteresis comparator 100 and the inverse signal VoutB of the output signal Vout, in order to adjust differential current signals In and Ip to generate adjusted differential current signals In' and Ip', wherein the common mode voltage detecting circuit 122 in the hysteresis current generating circuit 120 detects a common mode voltage of the differential input signals Vin and Vip for generating the hysteresis current Ihy. At last, the output stage 130 generates the output signal Vout according to the adjusted differential current signals In' and Ip'. In this embodiment, the hysteresis current Ihy generated by the hysteresis current generating circuit 120 is generated based on the common mode voltage of the differential current signals In and Ip, so as to keep the ratio of the hysteresis current Ihy to the tail current of the input stage 110 at a fixed value to stabilize a hysteresis voltage of the hysteresis comparator 100. More specifically, please refer to FIG. 2, which is a diagram illustrating the operations of the hysteresis comparator 100. In FIG. 2, when the signal Vip gradually increases to exceeding Vin (e.g. increasing to the level of VTH), the output signal Vout will change to the high voltage from the low voltage (i.e. switching to logic 1 from logic 0. Further, when the signal Vip gradually drops below Vin (e.g. dropping to the level of VTL), the output signal Vout will change to the low voltage from the high voltage (i.e. changing to logic 0 from logic 1), wherein "ΔV" in FIG. 2 represents the hysteresis voltage of the hysteresis comparator 100, and "ΔV" is proportional to the ratio of the hysteresis current Ihy to the tail current in the input stage 110. Hence, in this embodiment, since the ratio of the hysteresis current Ihy generated by the hysteresis current generating circuit 120 to the tail current in input stage 110 can be kept at a fixed value, the hysteresis voltage ΔV of the hysteresis comparator 100 can be thus stabilized.

Figure 3:
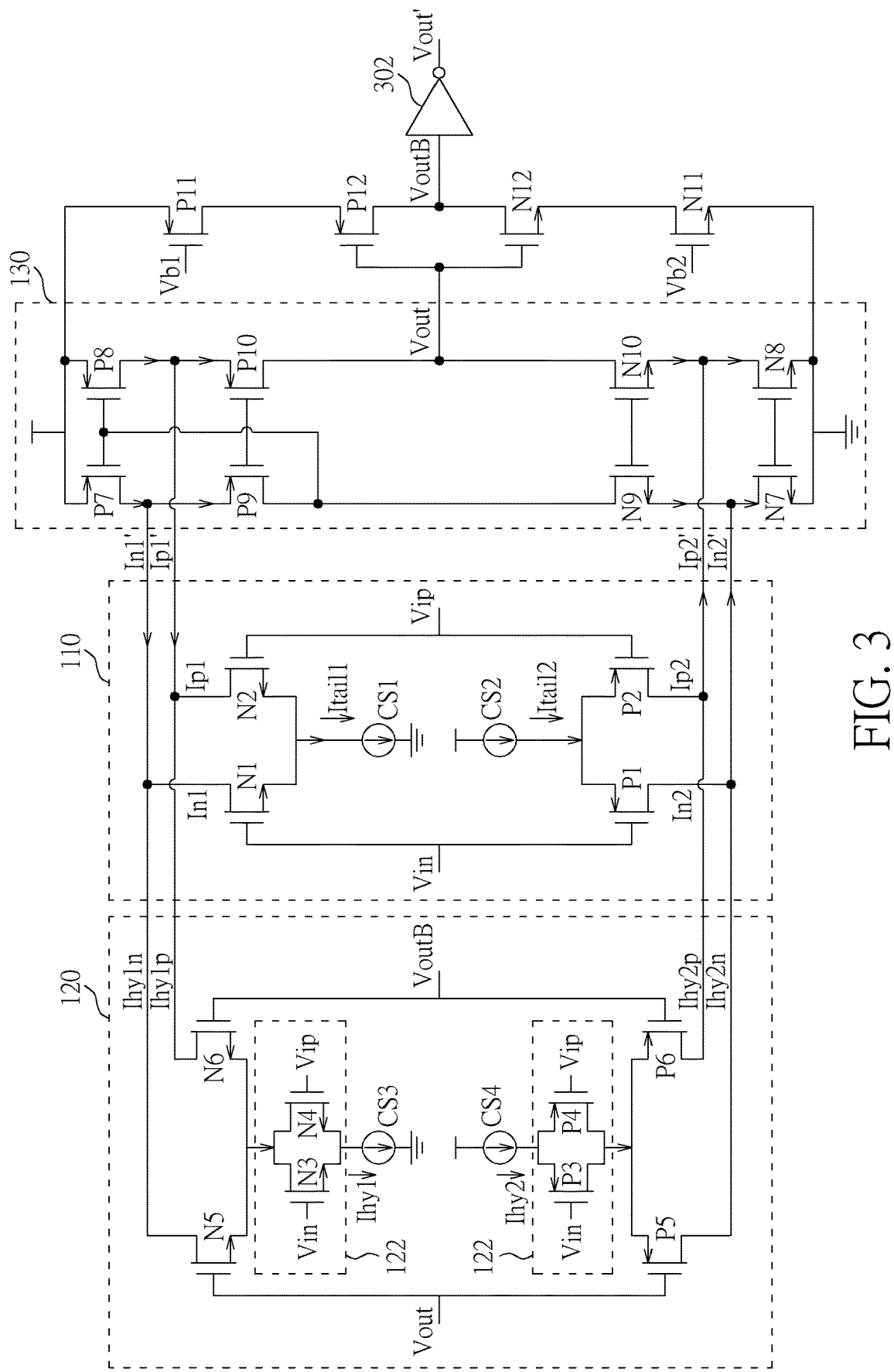
FIG. 3 is a diagram illustrating the detailed circuit architecture of the hysteresis comparator according to an embodiment of the present invention.

FIG. 3 is a diagram illustrating the detailed circuit architecture of the hysteresis comparator 100 according to an embodiment of the present invention. As shown in FIG. 3, the input stage 110 comprises two first N-type transistors N1 and N2, two first P-type transistors P1 and P2, a first current source CS1 and a second current source CS2, wherein the sources of the first N-type transistors N1 and N2 are coupled to the first current source CS1, and the gates of the first N-type transistors N1 and N2 receive differential input signals Vin and Vip respectively in order to generate differential current signals In1 and Ip1 at the respective drains thereof, wherein the tail current Itail1 shown in the figure is the summation of the current that respectively flow through the first N-type transistors N1 and N2. The sources of the first P-type transistors P1 and P2 are coupled to the second current source CS2, and the gates of the first P-type transistors P1 and P2 receive the differential input signals Vin and Vip respectively, in order to generate the differential current signal In2, Ip2 at the respective drains thereof, wherein the tail current Itail2 shown in the figure is the summation of the current that flow through the first P-type transistors P1 and P2. The common mode voltage detecting circuit 122 in the hysteresis current generating circuit 120 comprises two second N-type transistors N3, N4 and two P-type transistors P3, P4, and the hysteresis current generating circuit 120 further comprises two third N-type transistors N5, N6, two third P-type transistors P5, P6, a third current source CS3 and a fourth current source CS4, wherein the sources of the second N-type transistors N3, N4 are coupled to the third current source CS3, and the gates of the second N-type transistors N3, N4 respectively receive the differential input signals Vin and Vip in order to provide the hysteresis current Ihy1 to the sources of the third N-type transistors N5, N6, so that the sources of the third N-type transistors N5, N6 may receive the output signal Vout and the inverse signal VoutB thereof to generate the hysteresis currents Ihy1n, Ihy1p, to adjust the differential current signals In1 and Ip1 to generate adjusted differential current signals In1', Ip1'. The sources of the second P-type transistors P3, P4 are coupled to the fourth current source CS4, and the gates of the second P-type transistors P3, P4 receive the differential input signals Vin and Vip respectively, in order to provide the hysteresis current Ihy2 to the sources of the third P-type transistors P5, P6, for the sources of the third P-type transistors P5, P6 to receive the output signal Vout and the inverse signal VoutB thereof in order to generate the hysteresis currents Ihy2n, Ihy2p, thereby adjusting the differential current signals In2, Ip2 to generate the adjusted differential current signals In2', Ip2'. The output stage 130 comprises the P-type transistors P7, P8, P9 and P10 and the N-type transistors N7, N8, N9 and N10, and is used to receive the adjusted differential current signals In1', Ip1' and the adjusted differential current signals In2', Ip2' to generate the output signal Vout. FIG. 3 further depicts another output stage that comprises the P-type transistors P11, P12, the N-type transistor N11, N12 and an inverter 302, for generating the inverse signal VoutB of the output signal Vout and another output signal Vout', wherein the gate of the P-type transistor P11 and the gate of the N-type transistor N11 are coupled to the bias voltages Vb1, Vb2, respectively.

In the embodiment of FIG. 3, the differential input signals Vin and Vip are received by the first N-type transistors N1 and N2 receive respectively, and are also received by the second N-type transistors N3, N4 comprised in the common mode voltage detecting circuit 122 respectively. Hence, when the common mode voltage of the differential input signals Vin and Vip drops/rises, the tail current Itail1 in the input stage 110 and the hysteresis current Ihy1 (e.g. the summation of Ihy1n and Ihy1p) generated by the hysteresis current generating circuit 120 will also drop/rise, making the ratio of the tail current Itail1 to the hysteresis current Ihy1 remain at a fixed value. Similarly, the differential input signals Vin and Vip are received by the first P-type transistors P1 and P2, and are also received by the second P-type transistors P3, P4 comprised in the common voltage detecting circuit 122. Therefore, when the common mode voltage of the differential input signals Vin and Vip drops/rises, the tail current Itail2 in the input stage 110 and the hysteresis current Ihy2 (e.g. the summation of Ihy2n and Ihy2p) generated by the hysteresis current generating circuit 120 will also drop/rise, making the ratio of the tail current Itail2 to the hysteresis current Ihy2 remain at a fixed value. As illustrated above, the hysteresis comparator 100 may have a stable hysteresis voltage ΔV.

Figure 4:
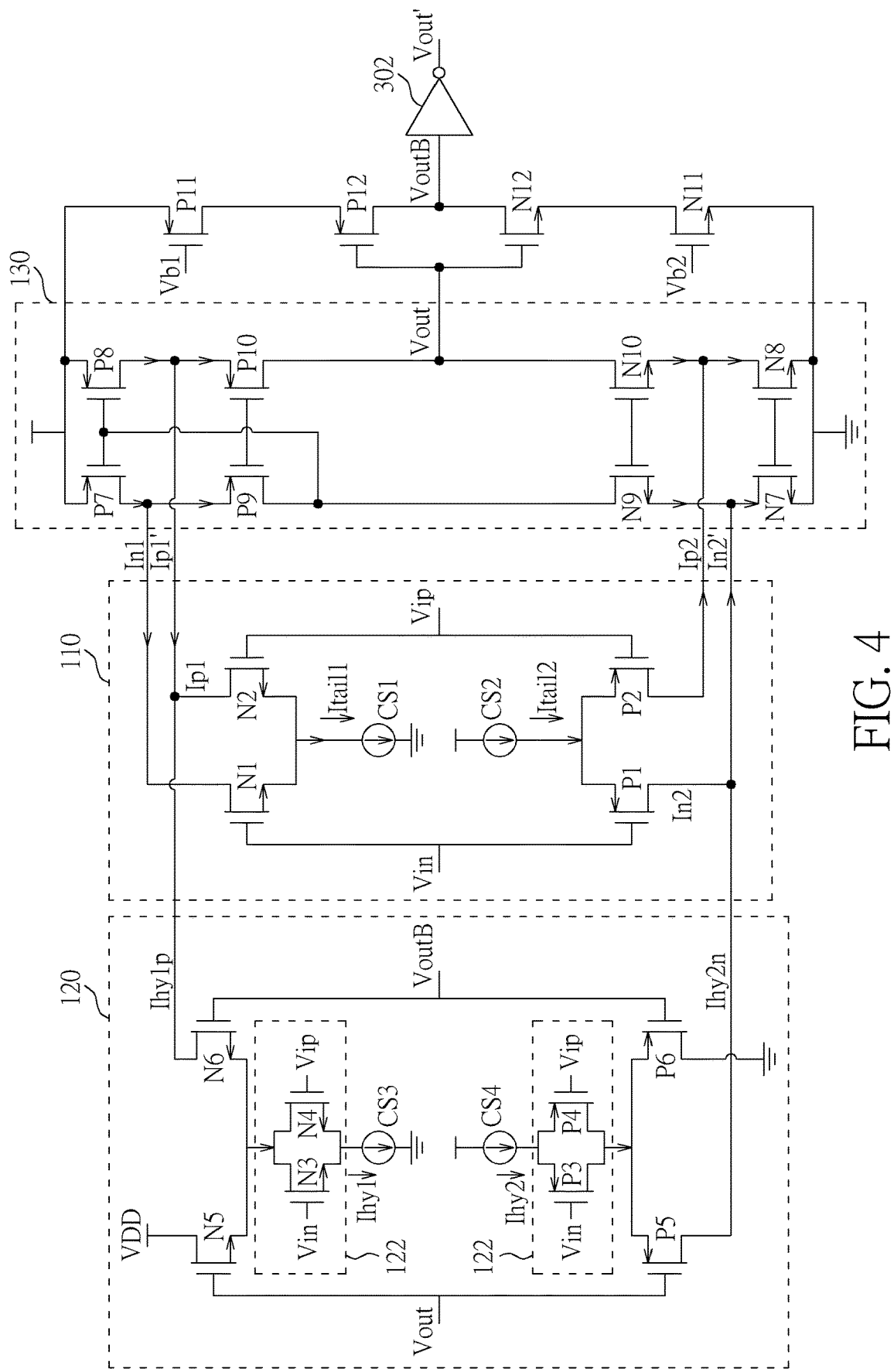
FIG. 4 is a diagram illustrating the detailed circuit architecture of the hysteresis comparator according to another embodiment of the present invention.

The hysteresis comparator 100 shown in FIG. 3 adopts the double-side hysteresis at the both sides. Other than that, the present invention also comprises the scenario shown in FIG. 4 where the hysteresis comparator 100 adopts a single-side hysteresis (i.e. the hysteresis voltage ΔV may equal to VTH or VTL in FIG. 2). The difference between the embodiment of FIG. 4 and FIG. 3 lies in that the drains of the third N-type transistor N5 in FIG. 4 is coupled to a reference voltage (e.g. the supplying voltage VDD), and thus does not provide the hysteresis current Ihy1n which is used for adjusting the current signal In1, and the drain of the third P-type transistor P6 in FIG. 4 is coupled to a reference voltage (e.g. a grounded voltage), and thus does not provide the hysteresis current Ihy2p for adjusting the current signal Ip2. Since one skilled in the art is readily to understand the associated operations of the embodiment in FIG. 4 after referring to the embodiment of FIG. 3, the detailed descriptions are omitted here for brevity.

In the embodiments of the present invention, as long as the common mode voltage detecting circuit 122 is set in the hysteresis current generating circuit 120 of the hysteresis comparator 100, a certain ratio of the hysteresis current to the tail current of the input stage 110 can be effectively maintained to stabilize the hysteresis voltage ΔV. In addition, in the present invention, the common mode voltage detecting circuit 122 is not set in the input stage 110, which means the tail current in the input stage 110 will not be adjusted because of the common mode voltage detecting circuit 122, and thus the common mode voltage detecting circuit 122 only requires very few circuit elements (such as the second N-type transistors N3, N4 and the second P-type transistors P3, P4 in FIG. 3) to achieve the goal of stabilizing the hysteresis voltage ΔV.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A hysteresis comparator, comprising:
    an input stage, configured to receive a pair of differential input signals to generate at least one differential current signal;
    a hysteresis current generating circuit, configured to generate at least one hysteresis current to adjust the differential current signal to generate an adjusted differential current signal, wherein the hysteresis current generating circuit comprises a common mode voltage detecting circuit to detect a common mode voltage of the differential input signals for generating the at least one hysteresis current; and
    an output stage, configured to generate an output signal according to the adjusted differential current signal;
    wherein the input stage receives the differential input signals to generate two differential current signals, and the input stage comprises:
        a first current source;
        two first N-type transistors, wherein the respective sources of the two first N-type transistors are coupled to the first current source, and each of the two first N-type transistors receives the differential input signals in order to generate one of the two differential current signals at the drain thereof;
        a second current source; and
        two first P-type transistors, wherein the sources of the two first P-type transistors are coupled to the second current source, and each of the two first P-type transistors receives the differential input signals in order to generate the other of the two differential current signals at the drain thereof;
    wherein the hysteresis current generating circuit generates two hysteresis currents of the at least one hysteresis current to adjust the two differential current signals to generate two adjusted differential current signals, and the common mode voltage detecting circuit in the hysteresis current generating circuit comprises:
two second N-type transistors, configured to receive the differential input signals to generate one of the two hysteresis currents, for adjusting one of the two differential current signals; and
two second P-type transistors, configured to receive the differential input signals to generate the other of the two hysteresis currents, for adjusting the other of the two differential current signals;
wherein the hysteresis current generating circuit comprises:
two third N-type transistors, wherein the two third N-type transistors are respectively controlled by the output signal and an inverse signal of the output signal, the sources of the two third N-type transistors are coupled to each other and are coupled to the drains of the two second N-type transistors, and the drains of the two third N-type transistors are coupled to the drains of the two first N-type transistors respectively; and
two third P-type transistors, wherein the two third P-type transistors are respectively controlled by the output signal and the inverse signal of the output signal, the sources of the two third P-type transistors are coupled to each other and are coupled to the drains of the two second P-type transistors, and the drains of the two third P-type transistors are coupled to the drains of the two first P-type transistors respectively.

2. The hysteresis comparator of claim 1, wherein the common mode voltage detecting circuit adjusts the two hysteresis currents only, without adjusting a tail current in the input stage.

3. The hysteresis comparator of claim 1, wherein the common mode voltage detecting circuit detects the common mode voltage of the differential input signals for generating the two hysteresis currents, to keep the ratio of a tail current in the input stage and a corresponding one of the two hysteresis currents at a fixed value.

4. A hysteresis comparator, comprising:
an input stage, configured to receive a pair of differential input signals to generate at least one differential current signal;
a hysteresis current generating circuit, configured to generate at least one hysteresis current to adjust the differential current signal to generate an adjusted differential current signal, wherein the hysteresis current generating circuit comprises a common mode voltage detecting circuit to detect a common mode voltage of the differential input signals for generating the at least one hysteresis current; and
an output stage, configured to generate an output signal according to the adjusted differential current signal;

wherein the input stage receives the differential input signals to generate two differential current signals, and the input stage comprises:
a first current source;
two first N-type transistors, wherein the respective sources of the two first N-type transistors are coupled to the first current source, and each of the two first N-type transistors receives the differential input signals in order to generate one of the two differential current signals at the drain thereof;
a second current source; and
two first P-type transistors, wherein the sources of the two first P-type transistors are coupled to the second current source, and each of the two first P-type transistors receives the differential input signals in order to generate the other of the two differential current signals at the drain thereof;
wherein the hysteresis current generating circuit generates two hysteresis currents of the at least one hysteresis current to adjust the two differential current signals to generate two adjusted differential current signals, and the common mode voltage detecting circuit in the hysteresis current generating circuit comprises:
two second N-type transistors, configured to receive the differential input signals to generate one of the two hysteresis currents, for adjusting one of the two differential current signals; and
two second P-type transistors, configured to receive the differential input signals to generate the other of the two hysteresis currents, for adjusting the other of the two differential current signals;
wherein the hysteresis current generating circuit comprises:
two third N-type transistors, wherein the two third N-type transistors are respectively controlled by the output signal and an inverse signal of the output signal, the sources of the two third N-type transistors are coupled to each other and are coupled to the drains of the two second N-type transistors, the drain of one of the two third N-type transistors is coupled to the drain of one of the two first N-type transistors, and the drain of the other of the two third N-type transistors is coupled to a reference voltage; and
two third P-type transistors, wherein the two third P-type transistors are respectively controlled by the output signal and the inverse signal of the output signal, the sources of the two third P-type transistors are coupled to each other and are coupled to the drains of the two second P-type transistors, and the drain of one of the two third P-type transistors is coupled to the drain of one of the two first P-type transistors, and the drain of the other of the two third P-type transistors is coupled to another reference voltage.

* * * * *